US009159583B2

(12) United States Patent
Ko et al.

(10) Patent No.: US 9,159,583 B2
(45) Date of Patent: Oct. 13, 2015

(54) METHODS OF MANUFACTURING NITRIDE SEMICONDUCTOR DEVICES

(71) Applicant: Electronics and Telecommunications Research Institute, Daejeon (KR)

(72) Inventors: Sang Choon Ko, Daejeon (KR); Jae Kyoung Mun, Daejeon (KR); Woojin Chang, Daejeon (KR); Sung-Bum Bae, Daejeon (KR); Young Rak Park, Daejeon (KR); Chi Hoon Jun, Daejeon (KR); Seok-Hwan Moon, Daejeon (KR); Woo-Young Jang, Seoul (KR); Jeong-Jin Kim, Jeonju-si (KR); Hyungyu Jang, Cheongju-si (KR); Je Ho Na, Seoul (KR); Eun Soo Nam, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/310,784

(22) Filed: Jun. 20, 2014

(65) Prior Publication Data
US 2015/0187599 A1 Jul. 2, 2015

(30) Foreign Application Priority Data

Dec. 30, 2013 (KR) ........................ 10-2013-0166516

(51) Int. Cl.
*H01L 21/33* (2006.01)
*H01L 21/321* (2006.01)
(Continued)

(52) U.S. Cl.
CPC ........ *H01L 21/3212* (2013.01); *H01L 21/0254* (2013.01); *H01L 21/283* (2013.01)

(58) Field of Classification Search
CPC ................. H01L 2924/00; H01L 2924/00014; H01L 33/0079; H01L 33/32; H01L 33/405; H01L 33/22; H01L 33/46; H01L 33/0075; H01L 21/0254; H01L 21/02639; H01L 21/02458; H01L 21/76254; H01L 21/6835; H01L 21/84; H01L 21/36; H01L 25/0657; H01L 25/50; H01L 31/1892; H01L 31/0725; H01L 29/2003; H01L 29/66136; H01L 21/3122; H01L 21/283; H01L 21/02507
See application file for complete search history.

(56) References Cited

U.S. PATENT DOCUMENTS 6,071,795 A * 6/2000 Cheung et al. ................. 438/458
7,759,701 B2 * 7/2010 Das et al. ...................... 257/194
(Continued)

FOREIGN PATENT DOCUMENTS

KR 2012-0032258 A 4/2012

OTHER PUBLICATIONS

Puneet Srivastava et al., "2 kV Breakdown Voltage GaN-on-Si DHFETs with Sub-micron Thin AlGaN Buffer", CS Mantech Conference, Apr. 23-26, 2012.
(Continued)

*Primary Examiner* — Brett Feeney
*Assistant Examiner* — Sophia Nguyen
(74) *Attorney, Agent, or Firm* — Rabin & Berdo, P.C.

(57) ABSTRACT

Provided is a method of manufacturing a nitride semiconductor device. The method includes forming a plurality of electrodes on a growth substrate on which first and second nitride semiconductor layers are sequentially stacked, forming upper metal layers on the plurality of electrodes respectively, removing the growth substrate to expose a lower surface of the first nitride semiconductor layer, and forming a third nitride semiconductor layer and a lower metal layer sequentially on the exposed lower surface of the first nitride semiconductor layer.

13 Claims, 6 Drawing Sheets

(51) Int. Cl.
*H01L 21/02* (2006.01)
*H01L 21/283* (2006.01)

(56) References Cited

U.S. PATENT DOCUMENTS

| | | | |
|---|---|---|---|
| 7,875,907 B2* | 1/2011 | Honea et al. | 257/192 |
| 8,338,313 B2 | 12/2012 | Zhang et al. | |
| 8,507,941 B2* | 8/2013 | Khan et al. | 257/99 |
| 8,809,085 B2* | 8/2014 | Sato et al. | 438/29 |
| 2001/0032999 A1* | 10/2001 | Yoshida | 257/332 |
| 2004/0157355 A1* | 8/2004 | Kachi et al. | 438/46 |
| 2008/0315257 A1* | 12/2008 | Shiraishi | 257/195 |
| 2009/0057684 A1* | 3/2009 | Otake et al. | 257/76 |
| 2009/0072272 A1* | 3/2009 | Suh et al. | 257/194 |
| 2009/0127564 A1* | 5/2009 | Irikura et al. | 257/76 |
| 2009/0146185 A1* | 6/2009 | Suh et al. | 257/194 |
| 2009/0179227 A1* | 7/2009 | Otake et al. | 257/192 |
| 2009/0179258 A1* | 7/2009 | Otake | 257/329 |
| 2009/0267078 A1* | 10/2009 | Mishra et al. | 257/76 |
| 2009/0267188 A1* | 10/2009 | Piner et al. | 257/613 |
| 2010/0034016 A1* | 2/2010 | Liu | 365/163 |
| 2010/0051963 A1* | 3/2010 | Otremba | 257/77 |
| 2010/0148145 A1* | 6/2010 | Ishibashi et al. | 257/13 |
| 2011/0136309 A1* | 6/2011 | Grivna et al. | 438/270 |
| 2011/0140172 A1* | 6/2011 | Chu et al. | 257/194 |
| 2011/0147796 A1* | 6/2011 | Haeberlen et al. | 257/194 |
| 2012/0074424 A1 | 3/2012 | Lee | |
| 2012/0146107 A1 | 6/2012 | Lim et al. | |
| 2012/0193677 A1* | 8/2012 | Parikh et al. | 257/190 |
| 2012/0205661 A1* | 8/2012 | Kyono et al. | 257/76 |
| 2013/0092958 A1* | 4/2013 | Chen et al. | 257/77 |
| 2013/0221363 A1* | 8/2013 | Prechtl et al. | 257/76 |
| 2013/0248879 A1 | 9/2013 | Gambin et al. | |
| 2013/0248931 A1* | 9/2013 | Saito et al. | 257/194 |
| 2013/0316507 A1* | 11/2013 | Saitoh et al. | 438/285 |
| 2014/0027709 A1* | 1/2014 | Higginson et al. | 257/13 |

OTHER PUBLICATIONS

Yasuhiro Oda et al., "Reduction of Buffer Leakage Current in AlGaN/GaN High-Electron-Mobility-Transistor Structure on Si Substrate by Reducing the Dislocation Density in AlN Buffer Layer", Proceedings of the 2nd European Microwave Integrated Circuits Conference, pp. 92-95, Oct. 2007.

* cited by examiner

METHODS OF MANUFACTURING NITRIDE SEMICONDUCTOR DEVICES

CROSS-REFERENCE TO RELATED APPLICATIONS

This U.S. non-provisional patent application claims priority under 35 U.S.C. §119 to Korean Patent Application No. 10-2013-0166516, filed on Dec. 30, 2013, the entire contents of which are hereby incorporated by reference.

BACKGROUND OF THE INVENTION

The present invention disclosed herein relates to methods of manufacturing nitride semiconductor devices, and more particularly, to methods of manufacturing ultra-thin nitride semiconductor devices.

A GaN-based compound semiconductor, which is a direct-transition-type semiconductor, allows emission of light of a wide range of wavelengths, e.g., from visible rays to ultraviolet rays. Compared to typical GaAs- or InP-based compound semiconductors, the GaN-based compound semiconductor has excellent properties such as high thermal/chemical stability, high electron mobility, high saturated electron velocity, and large energy bandgap. Due to such properties, GaN-based compound semiconductors are widely applied to the fields where the use of typical compound semiconductors is limited. For example, the GaN-based compound semiconductors are applied to optical devices such as visible light-emitting diodes (LEDs) and laser diodes (LDs) and electronic devices used in next-generation wireless communication or satellite communication systems required to have high power and high frequency characteristics. In particular, a nitride semiconductor ($Al_xIn_yGa_{1-x-y}N$) including aluminum (Al) is a next-generation nitride semiconductor material that may be used to manufacture a light-emitting device for the entire wavelength range of ultraviolet rays due to a high energy bandgap characteristic (3.4 eV-6.2 eV) of the nitride semiconductor. Furthermore, in the case where the nitride semiconductor forms a heterostructure (AlGaN/GaN, InAlN/GaN) together with GaN, an electronic device may be manufactured using a two-dimensional electron gas (2DEG) layer.

Various researches have been conducted to improve breakdown voltage characteristics of power semiconductor devices having a GaN-on-Si structure for which a bulk silicon substrate is used as a handle wafer. However, it has not been reported that GaN-based power semiconductor devices having a breakdown voltage of 600 V or higher have been commercialized. It may be important to develop a technology for manufacturing GaN-based power semiconductor devices having a high breakdown voltage so as to improve the GaN-based power semiconductor devices over Si- or SiC-based power semiconductor devices.

Furthermore, it is required to develop a technology for developing GaN-based power semiconductor devices having excellent electrical performance at a high temperature without being degraded in terms of electrical characteristics under a thermal environment, and having high breakdown voltage and improved characteristics of forward high current.

SUMMARY OF THE INVENTION

The present invention disclosed herein relates to a method of manufacturing an ultra-thin nitride semiconductor device having a high breakdown voltage and improved heat dissipation characteristics and high current characteristics.

Embodiments of the present invention provide methods of manufacturing a nitride semiconductor device, including forming a plurality of electrodes on a growth substrate on which first and second nitride semiconductor layers are sequentially stacked, forming upper metal layers on the plurality of electrodes respectively, removing the growth substrate to expose a lower surface of the first nitride semiconductor layer, and forming a third nitride semiconductor layer and a lower metal layer sequentially on the exposed lower surface of the first nitride semiconductor layer.

In some embodiments, prior to formation of the plurality of electrodes, the method may further include forming an active region by etching the first and second nitride semiconductor layers.

In other embodiments, prior to formation of the plurality of electrodes, the method may further include recessing a part of the second nitride semiconductor layer of the active region.

In still other embodiments, the plurality of electrodes may include first to third electrodes, the first and second electrodes may be formed on the recessed active region, and the third electrode may be formed on the active region between the first and second electrodes.

In even other embodiments, the first and second electrodes may ohmic-contact with the second nitride semiconductor layer.

In yet other embodiments, the first and second electrodes may include a structure in which silicon (Si), titanium (Ti), aluminum (Al), molybdenum (Mo) and gold (Au) are sequentially stacked.

In further embodiments, the third nitride semiconductor layer may include a material of which a bandgap is wider than that of a material of the first nitride semiconductor layer.

In still further embodiments, the third nitride semiconductor layer may include an aluminum nitride (AlN).

In even further embodiments, the removing the growth substrate may include thinning the growth substrate by performing lapping or chemical mechanical polishing (CMP), and dry-etching a lower surface of the thinned growth substrate.

In yet further embodiments, prior to removal of the growth substrate, the method may further include forming an insulating layer over the growth substrate, and forming a supporting substrate on the insulating layer.

In much further embodiments, the insulating layer may include poly methyl methacrylate (PMMA), and the supporting substrate may be bonded to the insulating layer by an adhesive disposed therebetween.

In still much further embodiments, the forming the lower metal layers may include sequentially stacking first to third sub metal layers, wherein the first to third sub metal layers may include a layered structure of titanium (Ti)/platinum (Pt)/gold (Au), titanium (Ti)/nickel (Ni)/gold (Au) or titanium (Ti)/nickel (Ni)/silver (Ag).

In even much further embodiments, the method may further include forming electrode pads on the upper metal layers.

In yet much further embodiments, the method may further include forming a fourth nitride semiconductor layer on the second nitride semiconductor layer.

In yet still much further embodiments, the first and second nitride semiconductor layers may form a heterostructure.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
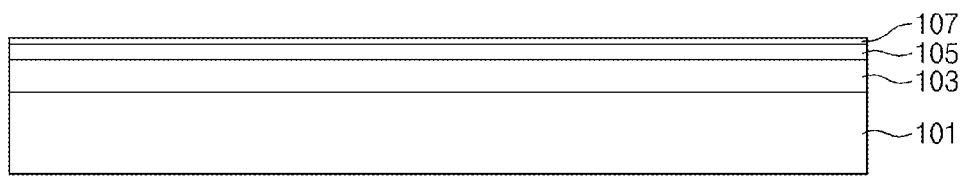
FIGS. 1 to 14 are cross-sectional views illustrating a method of manufacturing a nitride semiconductor device according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, it will be described about an exemplary embodiment of the present invention in conjunction with the accompanying drawings.

FIGS. 1 to 14 are cross-sectional views illustrating a method of manufacturing a nitride semiconductor device according to an embodiment of the present invention.

Referring to FIG. 1, first and second nitride semiconductor layers 103 and 105 may be sequentially formed on a growth substrate 101. The growth substrate 101 may be a silicon substrate, but is not limited thereto. The growth substrate 101 may have a thickness of about 650 micrometers. The first nitride semiconductor layer 103 may include GaN, and the second nitride semiconductor layer 105 may include AlGaN, InAlN or InAlGaN. The first and second nitride semiconductor layers 103 and 105 may be formed through an epitaxial growth process. The epitaxial growth process for forming the first and second nitride semiconductor layers may include at least one of metal organic chemical vapor deposition, liquid phase epitaxy, hydride vapor phase epitaxy, molecular beam epitaxy and metal organic vapor phase epitaxy. According to an embodiment, the first nitride semiconductor layer 103 may have a thickness of about 3 micrometers to about 4 micrometers, and the second nitride semiconductor layer 105 may have a thickness of about 0.2 micrometers. That is, the first and second nitride semiconductor layers 103 and 105 may be significantly thinner than the growth substrate 101.

The first nitride semiconductor layer 103 and the second nitride semiconductor layer 105 may form a heterostructure (e.g., AlGaN/GaN, InAlN/GaN or InAlGaN/GaN) so that a two-dimensional electron gas (2-DEG) layer (not illustrated) is formed in the vicinity of an interface between the first and second nitride semiconductor layers.

The nitride semiconductor device including nitride semiconductor layers of such a heterostructure may be applied to an RF power amplifier, a compound power semiconductor, an SBD, an MEMS resonator and a filter. Furthermore, the nitride semiconductor device is expected to be more widely applied to the fields where energy-saving compound devices are required, or devices are required to operate at a high temperature.

According to an embodiment, a third nitride semiconductor layer 107 may be formed on the second nitride semiconductor layer 105. The third nitride semiconductor layer 107 may include GaN, and may be formed in the same manner as the first and second nitride semiconductor layers 103 and 105. The third nitride semiconductor layer 107 may be thinner than the first and second nitride semiconductor layers 103 and 105. For example, the third nitride semiconductor layer may have a thickness of about 0.01 micrometer to about 0.02 micrometers.

Figure 2:
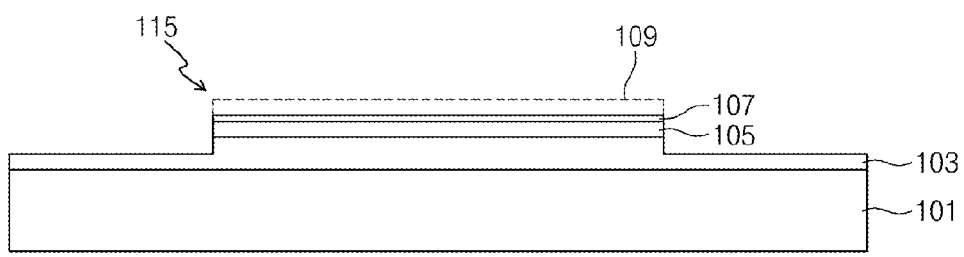

Referring to FIG. 2, the first to third nitride semiconductor layers 103, 105 and 107 may be etched so as to form an active region 115.

In detail, a photoresist pattern 109 may be formed on the third nitride semiconductor layer 107, and a dry etching process may be performed using the photoresist pattern 109 as an etching mask, so as to form the active region 115. The etching process may include reactive ion etching (RIE) or inductively coupled plasma (ICP) etching. Through this etching process, the second and third nitride semiconductor layers 105 and 107 adjacent to the active region 115 may be removed, but the first nitride semiconductor layer 103 may remain. Accordingly, the active region 115 may have a mesa form. As a result, the 2-DEG layer may be locally formed in the active region 115. The photoresist pattern 109 may be removed after the active region 115 is formed.

Figure 3:
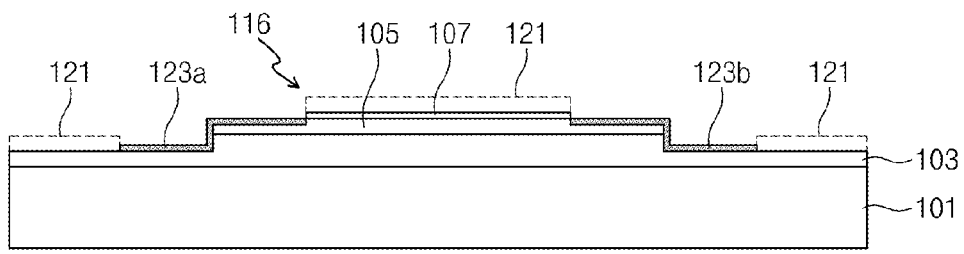

Referring to FIG. 3, first and second ohmic metal layers 123a and 123b may be formed on the second nitride semiconductor layer 105 at both ends of a recessed active region 116.

The first and second ohmic metal layers 123a and 123b may extend onto the first nitride semiconductor layer 103 adjacent to the recessed active region 116 while covering an upper surface of the second nitride semiconductor layer 105 at both ends of the recessed active region 116. In detail, an upper portion of the active region 115 (see FIG. 2) on which the first and second ohmic metal layers 123a and 123b are to be formed may be recessed. That is, the second and third semiconductor layers 105 and 107 at both ends of the active region 115 (see FIG. 2) may be etched. This etching process may include forming a mask pattern (not illustrated) on the resulting structure of FIG. 2 and performing a dry etching process using the mask pattern as an etching mask. At this time, the third nitride semiconductor layer 107 may be completely removed, and the second nitride semiconductor layer 105 may be partially removed. Thereafter, a photoresist pattern 121 may be formed, and a metal material may be deposited so as to form the first and second ohmic metal layers 123a and 123b. Since the ohmic metal layers 123a and 123b are formed on the recessed active region 116, a gap between the ohmic metal layers 123a and 123b and the 2-DEG layer decreases, thereby reducing resistance of the nitride semiconductor device according to an embodiment of the present invention.

According to an embodiment, the first and second ohmic metal layers 123a and 123b may include a layered structure of Ti/Al/Mo/Au. The first and second ohmic metal layers 123a and 123b may be formed through in-situ physical vapor deposition. According to another embodiment, the first and second ohmic metal layers 123a and 123b may further include Si. That is, the first and second ohmic metal layers 123a and 123b may include a layered structure of Si/Ti/Al/Mo/Au. The Si element may serve as an n-type dopant in the ohmic metal layers 123a and 123b so as to further reduce the resistance of the ohmic metal layers 123a and 123b.

After the first and second ohmic metal layers 123a and 123b are formed, the photoresist pattern 121 may be removed, and a thermal process may be performed. As a result, the first and second ohmic metal layers 123a and 123b may ohmic-contact with the first and second nitride semiconductor layers 103 and 105 disposed thereunder. This thermal process may include performing rapid thermal annealing (RTA) at a temperature of about 850 degrees.

Figure 4:
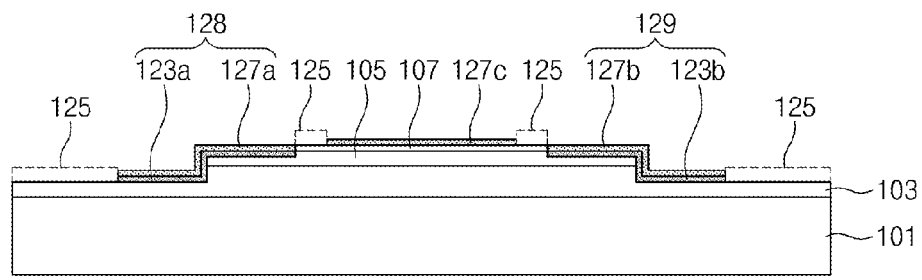

Referring to FIG. 4, first to third Schottky metal layers 127a to 127c may be formed on upper surfaces of the first and second ohmic metal layers 123a and 123b and the third nitride semiconductor layer 107 respectively.

In detail, a photoresist pattern 125 that exposes the upper surfaces of the first and second ohmic metal layers 123a and 123b and the third nitride semiconductor layer 107 may be formed on the resulting structure of FIG. 3 from which the photoresist pattern 121 has been removed, and then, a metal material may be deposited so as to form the first to third Schottky metal layers 127a to 127c. According to an embodiment, the first to third Schottky metal layers 127a to 127c may include a layered structure of Ni/Au. The first to third Schottky metal layers 127a to 127c may be formed through in-situ physical vapor deposition. Thereafter, the photoresist pattern 125 may be removed, and a thermal process may be performed. This thermal process may include performing rapid thermal annealing (RTA) at a temperature of about 350 degrees.

The first ohmic metal layers 123a and the first Schottky metal layer 127a disposed thereon may constitute a first electrode 128. Likewise, the second ohmic metal layer 123b and the second Schottky metal layer 127b disposed thereon may constitute a second electrode 129. The third Schottky metal layer 127c may constitute a third electrode. In the nitride semiconductor device according to an embodiment of the present invention, one of the first and second electrodes 128 and 129 may be a source electrode and the other may be a drain electrode. The third electrode may be a gate electrode. The nitride semiconductor device according to an embodiment of the present invention exemplarily includes a field effect transistor (FET), but is not limited thereto. For example, the method of manufacturing the nitride semiconductor device of the present invention may also be used to manufacture a nitride semiconductor device including a Schottky barrier diode (SBD).

Figure 5:
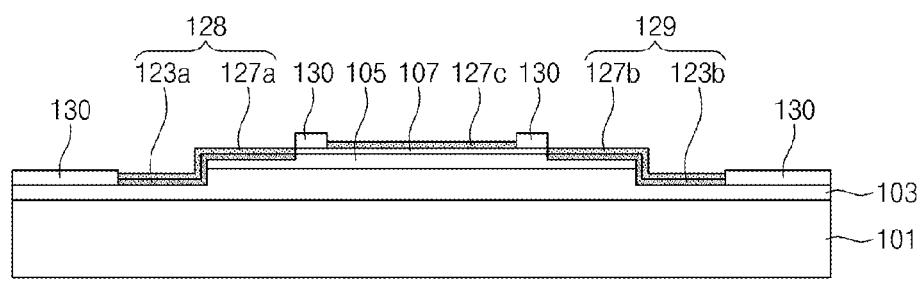

Referring to FIG. 5, first interlayer insulating patterns 130 may be formed on the resulting structure of FIG. 4 from which the photoresist pattern 125 (see FIG. 4) has been removed.

In detail, a first interlayer insulating layer may be formed over the growth substrate 101 on which the first to third electrodes 128, 129 and 127c are formed, and then, a patterning process may be performed so as to form the first interlayer insulating patterns 130. The first interlayer insulating layer may include a silicon oxide or a silicon nitride, and may be formed through a chemical vapor deposition process. The patterning process may include forming a mask pattern (not illustrated) on the first interlayer insulating layer and performing an etching process using the mask pattern as an etching mask.

Figure 6:
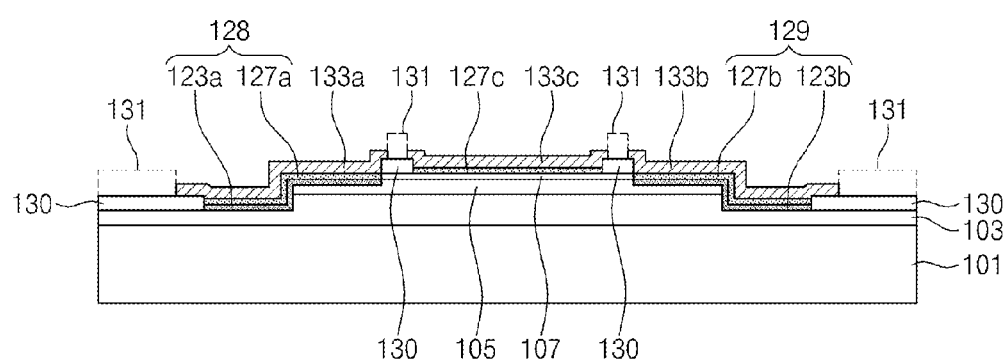

Referring to FIG. 6, first to third upper metal layers 133a to 133c may be formed on the first to third electrodes 128, 129 and 127c respectively.

The first to third upper metal layers 133a to 133c may be electrically separated from one another while covering upper surfaces of the first to third electrodes 128, 129 and 127c respectively. In detail, a seed layer (not illustrated) may be deposited on the resulting structure in which the first interlayer insulating patterns 130 are formed. Thereafter, a photoresist pattern 131 may be formed on the seed layer (not illustrated), and an electroplating process may be performed using the seed layer (not illustrated) exposed by the photoresist pattern 131 as a seed. Thereafter, the photoresist pattern 131 and the seed layer (not illustrated) disposed thereunder may be removed so as to form the first to third upper metal layers 133a to 133c. According to an embodiment, the first to third upper metal layers 133a to 133c may include Au. Here, the seed layer (not illustrated) may include Ti/Au. The upper metal layers 133a to 133c may be thicker than the electrodes 128, 129 and 127c. Therefore, the upper metal layers 133a to 133c may serve to prevent the nitride semiconductor device from being bent when the growth substrate 101 is removed at a following process.

Figure 7:
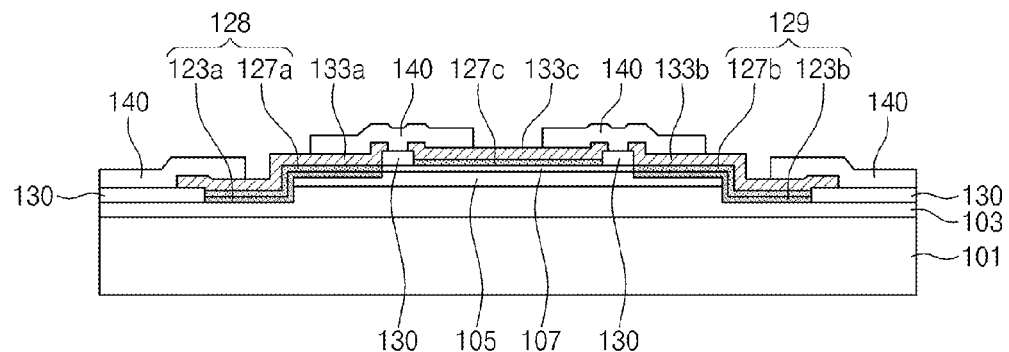

Referring to FIG. 7, second interlayer insulating patterns 140 may be formed on the resulting structure of FIG. 6 from which the photoresist pattern 131 (see FIG. 6) has been removed. A second interlayer insulating layer may be formed over the growth substrate 101 on which the first to third upper metal layers 133a to 133c are formed, and then, a patterning process may be performed so as to form the second interlayer insulating patterns 140. The second interlayer insulating layer may include a silicon oxide or a silicon nitride. The second interlayer insulating layer may include a layered structure of silicon oxide layer/silicon nitride layer. The second interlayer insulating layer may be formed through a chemical vapor deposition process. The patterning process may include forming a mask pattern (not illustrated) on the second interlayer insulating layer and performing an etching process using the mask pattern as an etching mask. The second interlayer insulating patterns 140 may partially expose the first to third upper metal layers 133a to 133c. The second interlayer insulating patterns 140 may be formed to such thicknesses as to endure high breakdown voltage.

Figure 8:
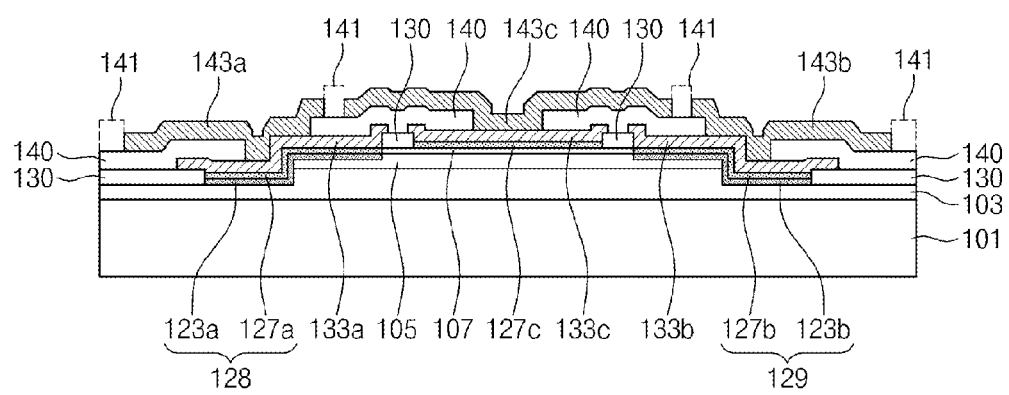

Referring to FIG. 8, first to third electrode pads 143a to 143c that cover the upper surfaces of the first to third upper metal layers 133a to 133c respectively may be formed.

In detail, a photoresist pattern 141 that exposes the upper surfaces of the first to third upper metal layers 133a to 133c may be formed on the resulting structure of FIG. 7, and then, a metal material may be deposited. Thereafter, the photoresist pattern 141 may be removed so as to form the first to third electrode pads 143a to 143c. The first to third electrode pads 143a to 143c may be connected to the first to third metal layers 133a to 133c respectively, and extend to upper surfaces of adjacent second interlayer insulating patterns 140. The first to third electrode pads 143a to 143c may be electrically separated from one another. According to an embodiment, the first to third electrode pads 143a to 143c may include Al. Since the electrode pads 143a to 143c are vertically arranged on the electrodes 128, 129 and 127c, the electrode pads 143a to 143c may have relatively large areas in comparison with the case where the electrode pads and the electrodes are coplanar.

Figure 9:
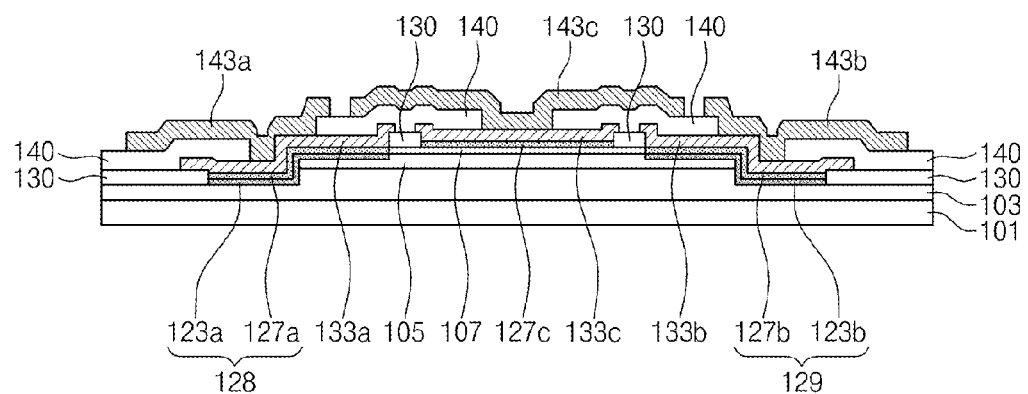

Referring to FIG. 9, a substrate thinning process may be performed so as to recess a lower surface of the growth substrate 101. The thinning process may include lapping and/or chemical mechanical polishing (CMP). The recessing of the lower surface of the growth surface 101 may be a preliminary process to completely remove the growth substrate 101 through dry etching at a following process. According to another embodiment, the substrate thinning process may be performed after a supporting substrate 160 of FIG. 10 is formed.

Figure 10:
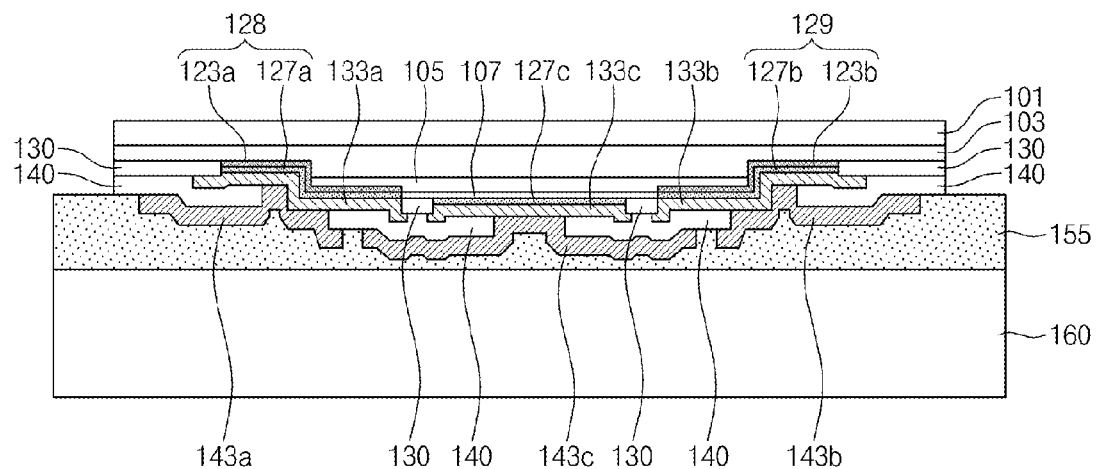

Referring to FIG. 10, an insulating layer 155 and the supporting substrate 160 may be formed so as to cover over the substrate 101 on which the first to third electrode pads 143a to 143c are formed.

According to an embodiment, the insulating layer 155 may include poly methyl methacrylate (PMMA). For example, PMMA may be coated on the resulting structure of FIG. 9 at a speed of about 2000 rpm, and then, a thermal process may be performed three or four times at a temperature of about 180 degrees, so as to form the insulating layer 155. The supporting substrate 160 may include a sapphire substrate or a silicon carbide substrate. Although not illustrated, an adhesive layer may be further formed between the insulating layer 155 and the supporting layer 160 to bond the insulating layer 155 and the supporting substrate 160. For example, the adhesive layer may include wax. The supporting substrate 160 may serve as a handling wafer at a following process.

Figure 11:
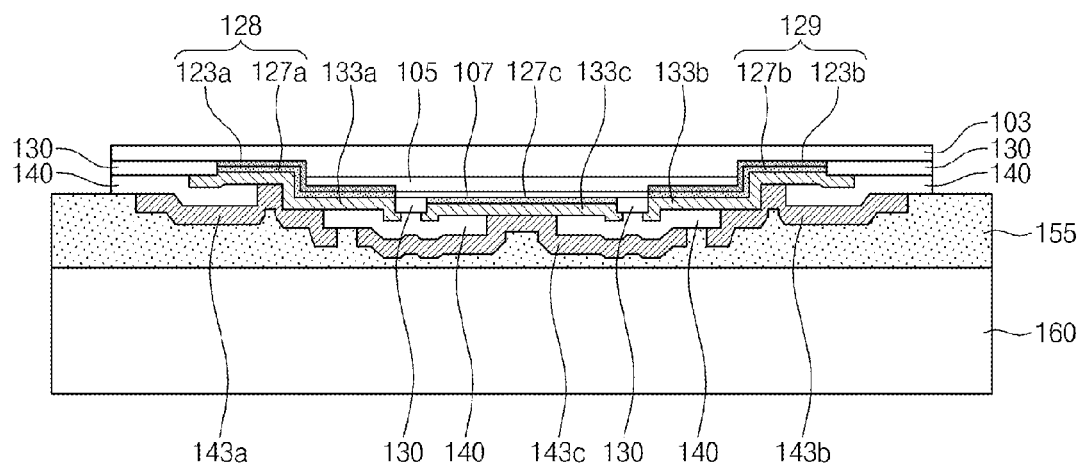

Referring to FIG. 11, the substrate 101 (see FIG. 10) may be completely removed so that the first nitride semiconductor layer 103 is exposed. In detail, the substrate 101 (see FIG. 10) may be removed by performing a dry etching process using an etchant capable of selectively removing a material (e.g., silicon) of the substrate 101 (see FIG. 10). This etching process may include deep reactive ion etching (RIE). The first nitride semiconductor layer 103 exposed by the etching may serve as an etch stop layer. As the substrate 101 (see FIG. 10) is completely removed, the nitride semiconductor device according to an embodiment of the present invention may be realized as an ultra-thin device.

Figure 12:
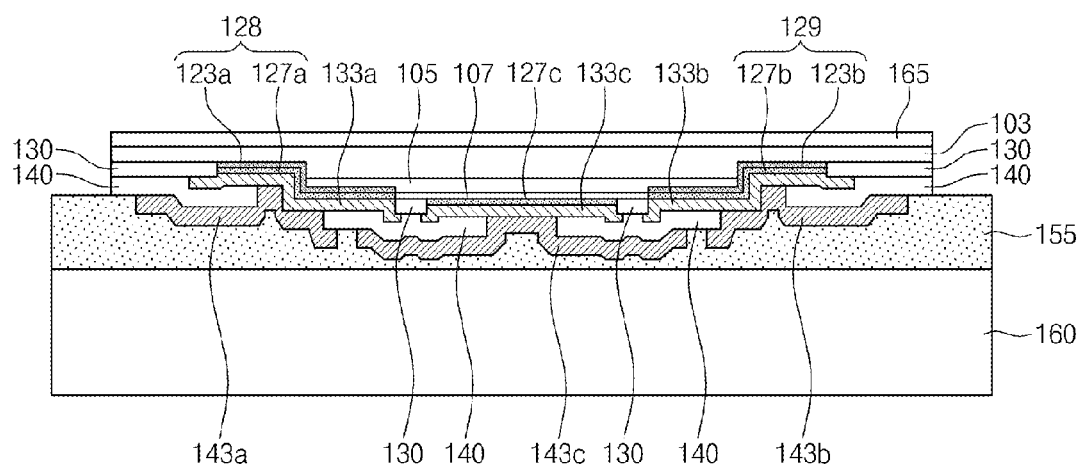

Referring to FIG. 12, a fourth nitride semiconductor layer 165 may be formed on the first nitride semiconductor layer 103 from which the substrate 101 (see FIG. 10) has been removed. The fourth nitride semiconductor layer 165 may be formed of a material of which a bandgap is wider than that of the material of the first nitride semiconductor layer in order to improve a breakdown voltage of the nitride semiconductor device. For example, the fourth nitride semiconductor layer 165 may include MN. Like the first to third nitride semiconductor layers 103, 105 and 107, the fourth nitride semiconductor layer 165 may be formed through an epitaxial growth process.

Figure 13:
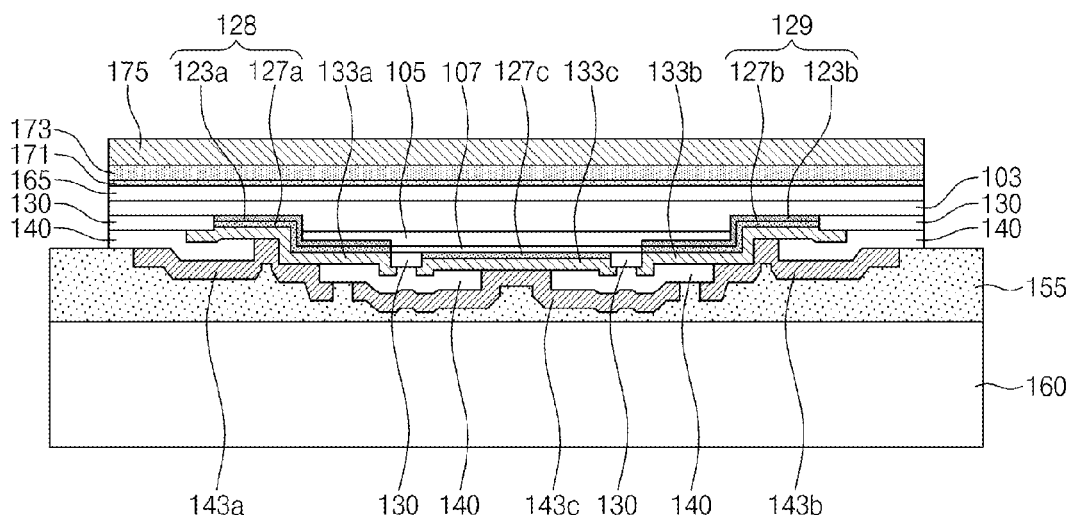

Referring to FIG. 13, a lower metal layer 170 may be formed on the fourth nitride semiconductor layer 165. In detail, the lower metal layer 170 may include first to third sub metal layers 171, 173 and 175. That is, the first to third sub metal layers 171, 173 and 175 may be sequentially stacked on the fourth nitride semiconductor layer 165 so as to form the lower metal layer 170. According to an embodiment, the first to third sub metal layers 171, 173 and 175 may have a layered structure of Ti/Pt/Au, Ti/Ni/Au or Ti/Ni/Ag. That is, the first sub metal layer 171 may include Ti, the second sub metal layer 173 may include Pt or Ni, and the third sub metal layer 175 may include Au or Ag. The first to third sub metal layers 171, 173 and 175 may be formed through physical vapor deposition and/or electroplating. The lower metal layer 170 may reduce the bending phenomenon that may occur due to removal of the substrate 101 (see FIG. 10), and may improve heat dissipation characteristics of the nitride semiconductor device according to an embodiment of the present invention.

Figure 14:
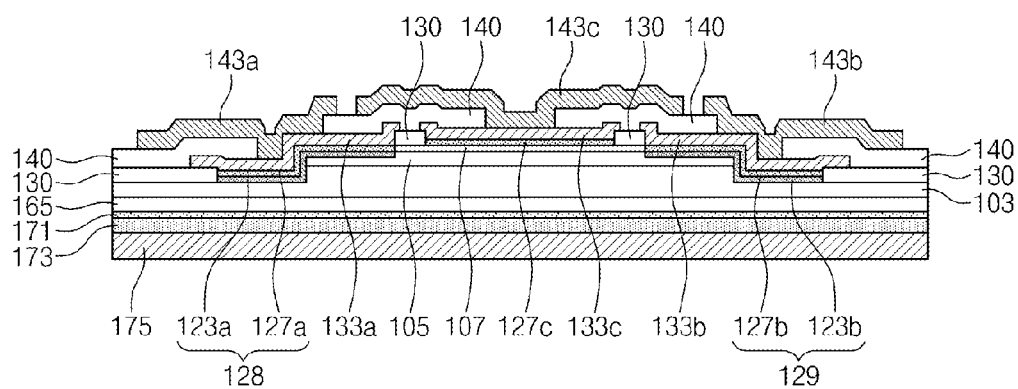

Referring to FIG. 14, the manufacturing of the nitride semiconductor device according to an embodiment of the present invention may be completed by removing the insulating layer 155 and the supporting substrate 160 of FIG. 13. In detail, the supporting layer 160 may be removed through a thermal process, and the insulating layer 155 may be removed by performing a cleaning process using a cleaning solution including trichloroethene and acetone.

The nitride semiconductor device according to an embodiment of the present invention will be described with reference to FIG. 14.

Referring to FIG. 14, the fourth nitride semiconductor layer 165, the first nitride semiconductor layer 103, the second nitride semiconductor layer 105, and the third nitride semiconductor layer 107 may be sequentially provided on the lower metal layer 170. The lower metal layer 170 may include the first to third sub metal layers 171, 173 and 175. According to an embodiment, the first sub metal layer 171 may include Ti, the second sub metal layer 173 may include Pt or Ni, and the third sub metal layer 175 may include Au or Ag. Accordingly, the lower metal layer 170 may include a layered structure of Au/Pt/Ti, Au/Ni/Ti or Ag/Ni/Ti.

The fourth nitride semiconductor layer 165, the first nitride semiconductor layer 103, the second nitride semiconductor layer 105, and the third nitride semiconductor layer 107 may be nitride semiconductor layers and may include epitaxial layers. The fourth nitride semiconductor layer 165 may include a material of which a bandgap is wider than that of the material of the first nitride semiconductor layer 103. For example, the fourth nitride semiconductor layer 165 may include MN. The first nitride semiconductor layer 103 and the second nitride semiconductor layer 105 may form a heterostructure. For example, the first nitride semiconductor layer 103 may include GaN, and the second nitride semiconductor layer 105 may include AlGaN, InAlN or InAlGaN. Since the heterostructure (e.g., AlGaN/GaN, InAlN/GaN or InAlGaN/GaN) is formed the two-dimensional electron gas (2-DEG) layer (not illustrated) may be formed in the vicinity of an interface between the first and second nitride semiconductor layers 103 and 105. The third nitride semiconductor layer 107 may include GaN.

Each of the first nitride semiconductor layer 103 and the second nitride semiconductor layer 105 may have a mesa form. That is, the first nitride semiconductor layer 103 may have a portion protruding from the upper surface of the first nitride semiconductor layer 103, and the second nitride semiconductor layer 105 may be arranged on the protruding portion of the first nitride semiconductor layer 103. Furthermore, the second nitride semiconductor layer 105 may have a portion protruding from the upper surface of the second nitride semiconductor layer 105, and the third nitride semiconductor layer 107 may be arranged on the protruding portion of the second nitride semiconductor layer 105.

The first and second electrodes 128 and 129 may be provided to both ends of the second nitride semiconductor layer 105 to which the third nitride semiconductor layer 107 is not provided. The first and second electrodes 128 and 129 may extend onto the first nitride semiconductor layer 103 while covering the upper surface of the second nitride semiconductor layer 105. The first and second electrodes 128 and 129 may contact with sidewalls of the first interlayer insulating patterns 130 provided outside the first nitride semiconductor layer 103. The third electrode 127c may be provided on the third nitride semiconductor layer 107. The third electrode 127c may contact with the sidewalls of the first interlayer insulating patterns 130 provided to both ends of the third nitride semiconductor layer 107 while covering the upper surface of the third nitride semiconductor layer 107. The first interlayer insulating patterns 130 may include a silicon oxide or a silicon nitride.

The first electrode 128 may include the first ohmic metal layer 123a and the first Schottky metal layer 127a. The second electrode 129 may include the second ohmic metal layer 123b and the second Schottky metal layer 127b. The third electrode may include the third Schottky metal layer 127c.

The ohmic metal layers 123a and 123b may include a layered structure of Ti/Al/Mo/Au, and may further include Si. That is, the ohmic metal layers 123a and 123b may include a layered structure of Si/Ti/Al/Mo/Au. The first and second ohmic metal layers 123a and 123b may ohmic-contact with the first and second nitride semiconductor layers 103 and 105 disposed thereunder. The Schottky metal layers 127a to 127c may include a layered structure of Ni/Au.

The first to third upper metal layers 133a to 133c may be provided on the first to third electrodes 128, 129 and 127c respectively. That is, the first to third upper metal layers 133a to 133c may cover the upper surfaces of the first to third electrodes 128, 129 and 127c respectively. The first to third upper metal layers 133a to 133c may include Au.

The second interlayer insulating patterns 140 may be provided on the first interlayer insulating patterns 130. The second interlayer insulating patterns 140 may partially cover the upper surfaces of the first to third electrodes 128, 129 and 127c. That is, the second interlayer insulating patterns 140 may expose the first to third electrodes 128, 129 and 127c. The second interlayer insulating patterns 140 may include a silicon oxide or a silicon nitride. The second interlayer insulating patterns 140 may include a layered structure of a silicon oxide and a silicon nitride, and may have such thicknesses as to endure high breakdown voltage.

The first to third electrode pads 143a to 143c may be provided on the first to third upper metal layers 133a to 133c exposed through gaps between the second interlayer insulating patterns 140. The first electrode pad 143a may extend to the upper surfaces of adjacent second interlayer insulating patterns 140 while covering the upper surface of the first upper metal layer 133a exposed through a gap between the second interlayer insulating patterns 140. The second electrode pad 143b may extend to the upper surfaces of adjacent second interlayer insulating patterns 140 while covering the upper surface of the second upper metal layer 133b exposed through a gap between the second interlayer insulating patterns 140. The third electrode pad 143c may extend to the upper surfaces of adjacent second interlayer insulating patterns 140 while covering the upper surface of the third upper metal layer exposed through a gap between the second interlayer insulating patterns 140. The first to third electrode pads 143a to 143c may be electrically separated from one another.

According to the ultra-thin nitride semiconductor device and the method of manufacturing the same according to the embodiments of the present invention, a substrate is removed and a material having a wide bandgap is formed thereunder, and thus, leakage current is reduced and high breakdown voltage may be obtained. Furthermore, according to the ultra-thin nitride semiconductor device and the method of manufacturing the same according to the embodiments of the present invention, metal layers are formed on and under the device in order to reduce the bending phenomenon caused due to the removal of the substrate, and thus, mechanical stability of the device may be secured and heat dissipation characteristics of the device may be improved. Moreover, according to the ultra-thin nitride semiconductor device and the method of manufacturing the same according to the embodiments of the present invention, ohmic metal layers are formed on the recessed active region and impurities are injected into the ohmic metal layers, thereby reducing ohmic-contact resistance and improving high current characteristics.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of manufacturing a nitride semiconductor device, the method comprising:
    forming a plurality of electrodes on a growth substrate on which first and second nitride semiconductor layers are sequentially stacked;
    forming upper metal layers on the plurality of electrodes respectively;
    removing the growth substrate to expose a lower surface of the first nitride semiconductor layer;
    forming a third nitride semiconductor layer and a lower metal layer sequentially on the exposed lower surface of the first nitride semiconductor layer;
    prior to formation of the plurality of electrodes, forming an active region by etching the first and second nitride semiconductor layers; and
    prior to formation of the plurality of electrodes, recessing a part of the second nitride semiconductor layer of the active region.

2. The method of claim 1, wherein
    the plurality of electrodes comprise first to third electrodes,
    the first and second electrodes are formed on the recessed active region, and
    the third electrode are formed on the active region between the first and second electrodes.

3. The method of claim 2, wherein the first and second electrodes ohmic-contact with the second nitride semiconductor layer.

4. The method of claim 3, wherein the first and second electrodes comprise a structure in which silicon (Si), titanium (Ti), aluminum (Al), molybdenum (Mo) and gold (Au) are sequentially stacked.

5. The method of claim 1, wherein the third nitride semiconductor layer comprises a material of which a bandgap is wider than that of a material of the first nitride semiconductor layer.

6. The method of claim 5, wherein the third nitride semiconductor layer comprises an aluminum nitride (AlN).

7. The method of claim 1, wherein the removing the growth substrate comprises:
    thinning the growth substrate by performing lapping or chemical mechanical polishing (CMP); and
    dry-etching a lower surface of the thinned growth substrate.

8. The method of claim 1, prior to removal of the growth substrate, further comprising:
    forming an insulating layer over the growth substrate; and
    forming a supporting substrate on the insulating layer.

9. The method of claim 8, wherein the insulating layer comprises poly methyl methacrylate (PMMA), and the supporting substrate is bonded to the insulating layer by an adhesive disposed therebetween.

10. The method of claim 1, wherein the forming the lower metal layers comprises sequentially stacking first to third sub metal layers, and wherein the first to third sub metal layers comprise a layered structure of titanium (Ti)/platinum (Pt)/gold (Au), titanium (Ti)/nickel (Ni)/gold (Au) or titanium (Ti)/nickel (Ni)/silver (Ag).

11. The method of claim 1, further comprising forming electrode pads on the upper metal layers.

12. The method of claim 1, further comprising forming a fourth nitride semiconductor layer on the second nitride semiconductor layer.

13. The method of claim 1, wherein the first and second nitride semiconductor layers form a hetero structure.

* * * * *